United States Patent [19]

Epsom et al.

[11] 4,430,619
[45] Feb. 7, 1984

[54] ADAPTIVE RADIO FREQUENCY INTERMODULATION MINIMIZING APPARATUS

[75] Inventors: Robert L. Epsom, Hanover Park; Paul H. Gailus, Chicago; Anthony P. van den Heuvel, Arlington Heights, all of Ill.

[73] Assignee: Motorola, Inc., Schaumburg, Ill.

[21] Appl. No.: 336,194

[22] Filed: Dec. 31, 1981

[51] Int. Cl.³ .................... H03F 1/26; H04B 15/00
[52] U.S. Cl. .................... 330/149; 328/162; 330/286; 330/53; 333/1.1; 333/17 M; 455/295
[58] Field of Search .......... 330/149, 286, 287, 53; 333/17 R, 17 M, 1.1; 455/295; 328/162 (U.S. only), 163 (U.S. only), 165 (U.S. only)

[56] References Cited

FOREIGN PATENT DOCUMENTS 2423457 11/1975 Fed. Rep. of Germany ....... 333/1.1

Primary Examiner—James B. Mullins
Assistant Examiner—Steven J. Mottola
Attorney, Agent, or Firm—Mark P. Kahler; Edward M. Roney; James W. Gillman

[57] ABSTRACT

Apparatus is provided for inhibiting the generation of intermodulation products in a radio frequency amplifier coupled to a circulator. A control circuit generates a control signal exhibiting indicia of the amount of isolation provided by the circulator. The control signal is provided to a variable impedance synthesis circuit coupled to the circulation isolation port such that the impedance synthesis circuit exhibits the appropriate impedance to maximize circulation isolation. Intermodulation is thus minimized.

13 Claims, 14 Drawing Figures

SMITH CHART

| $R_{182}$ | $R_{192}$ | $Z_{OUT}$ | POINT ON FIG.6 SMITH CHART |
|---|---|---|---|
| 0Ω (ON) | 0Ω (ON) | 40.2+j8.2 | 201 |
| ∞Ω (OFF) | ∞Ω (OFF) | 59.8−j12.2 | 202 |
| 0Ω (ON) | ∞Ω (OFF) | 40.2−j8.2 | 203 |
| ∞Ω (OFF) | 0Ω (ON) | 59.8+j12.2 | 204 |
| 50Ω | ∞Ω (OFF) | 49−j9.9 | 205 |
| 50Ω | 0Ω (ON) | 49+j9.9 | 206 |
| 0Ω (ON) | 50Ω | 40.9Ω+j0 | 207 |
| 50Ω | 50Ω | 50Ω | 208 |
| ∞Ω (OFF) | 50Ω | 61.11Ω+j0 | 209 |
Fig.7
| STATE | A | B | P |
|---|---|---|---|
| 1 | 1 | 0 | 1 /180° |
| 2 | 0 | 1 | 1 /60° |
| 3 | 0 | 0 | 1 /−60° |
| 1 | 1 | 0 | 1 /180° |
| 2 | 0 | 1 | 1 /60° |
| 3 | 0 | 0 | /−60° |
| ⋮ | ⋮ | ⋮ | ⋮ |
Fig.9
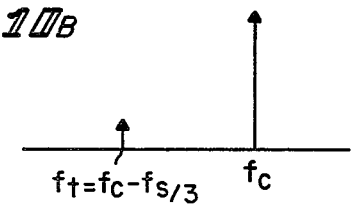
Fig.10B
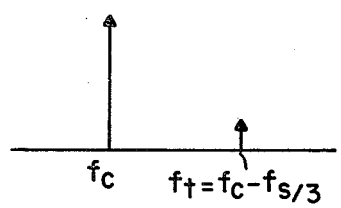
Fig.10C
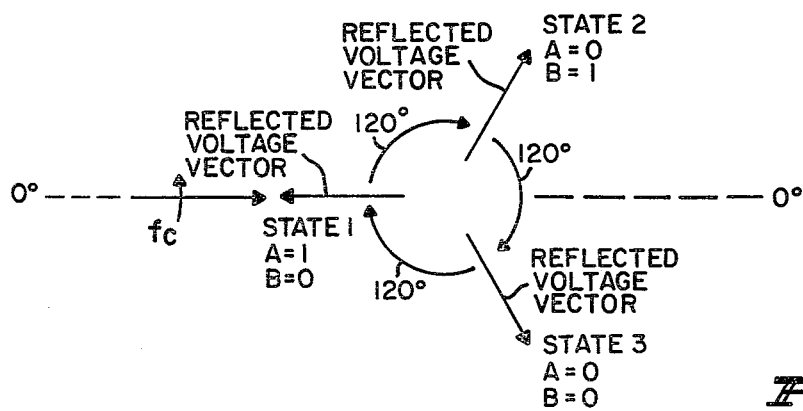
Fig.10A

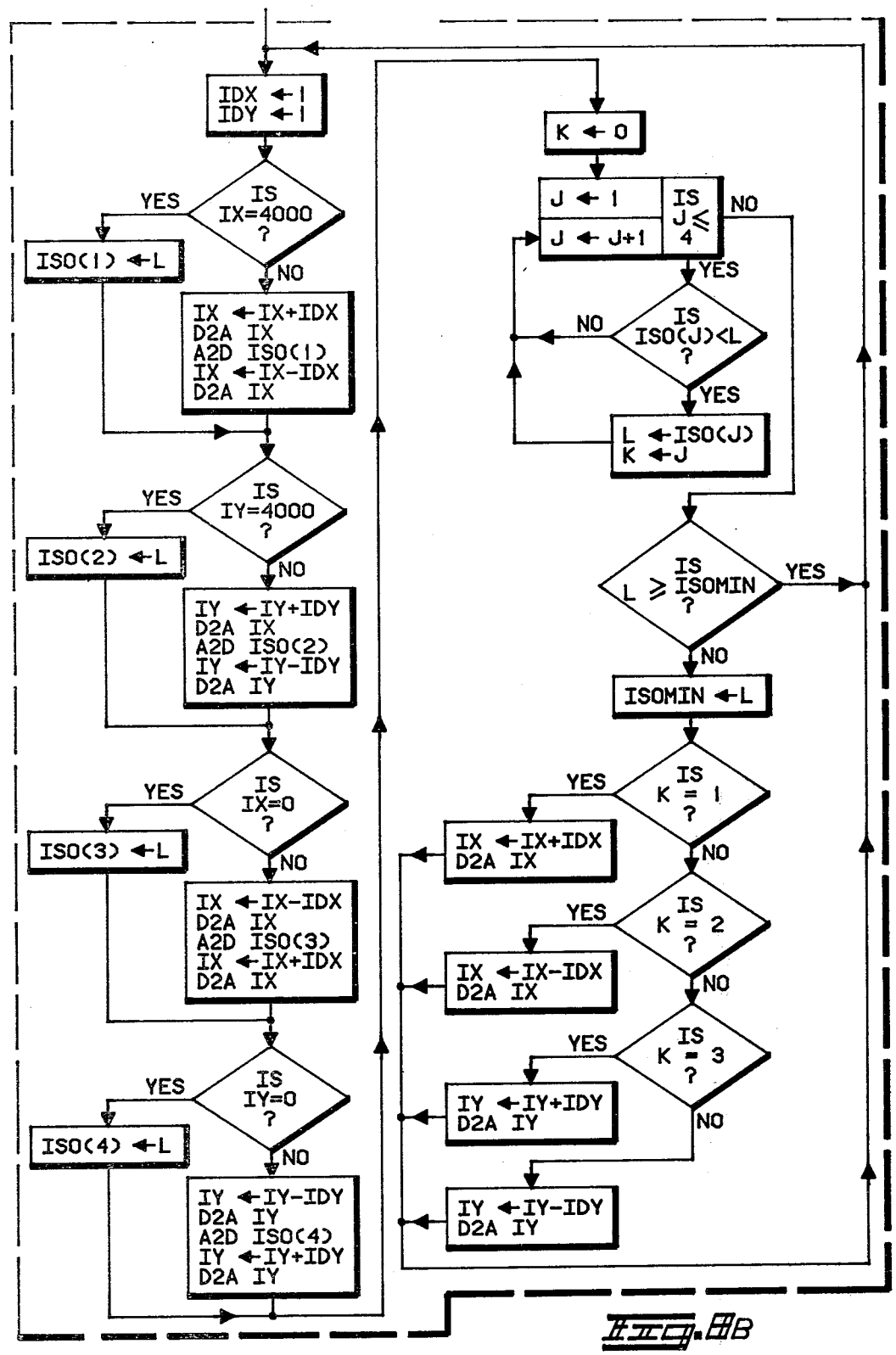

ADAPTIVE RADIO FREQUENCY INTERMODULATION MINIMIZING APPARATUS

BACKGROUND OF THE INVENTION

This invention relates to apparatus for reducing the amplitude of intermodulation products in radio frequency amplifiers, and, more particularly to substantially reducing the amplitude of intermodulation products in transmitter radio frequency amplifiers employing a circulator for isolation purposes.

DESCRIPTION OF THE PRIOR ART

Intermodulation is a problem often encountered in contemporary radio frequency power amplifiers. Such undesired intermodulation distortion products must be substantially attenuated or avoided by appropriate circuitry in order to prevent the generation of undesired spurious signals by radio frequency transmitters.

To illustrate and define the problem of intermodulation product generation in radio frequency power amplifiers, FIG. 1A shows a transmitter radio frequency power amplifier 10 which is amplifying or generating a radio frequency carrier signal exhibiting a frequency $f_c$ and its output as shown. The output of amplifier 10 is coupled to an antenna 20 such that the radio frequency carrier signal $f_c$ is radiated by antenna 20. As seen in FIG. 1A, amplifier 10 and antenna 20 are situated in close proximity to another antenna 30 which is radiating a radio frequency carrier signal exhibiting a frequency $f_1$. For purposes of discussion, $f_1$ is assumed to be greater than $f_c$ by an amount $\Delta f$. The frequencies $f_1$ and $f_c$ are relatively close to each other. Due to the relatively close proximity of antennas 20 and 30, the carrier signal $f_1$ from antenna 30 appears at amplifier 10 as well as the carrier frequency signal $f_c$. These two radio frequency carrier signals $f_c$ and $f_1$ interact at amplifier 10 and generate a first intermodulation distortion product exhibiting a frequency of $2f_c - f_1$ and a second intermodulation distortion product exhibiting a frequency of $2f_1 - f_c$.

The relationship in frequency between carrier signals $f_c$, $f_1$, and the first and second intermodulation products is shown in the amplitude versus frequency graph of FIG. 1B. It is noted that the amplitudes of the signals displayed in the FIG. 1B are not to scale. It is further noted, however, that the amplitude of the first intermodulation product at frequency $2f_c - f_1$ is substantial whereas the amplitude of the second intermodulation product at a frequency of $2f_1 - f_c$ is typically relatively small. The importance of substantially reducing the amplitude of the first intermodulation product is thus readily appreciated.

To reduce the amplitude of the first intermodulation product which appears at antenna 20 as an undesired output signal, a number of approaches have been employed in the past. One way to limit the amplitude of the first intermodulation product radiated by antenna 20 in conjunction with amplifier 10 is to take action to assure that the amplitude of the $f_1$ signal reaching antenna 20 is as small as possible. For example, separating antenna 20 and antenna 30 by a great distance may reduce the problem of intermodulation product generation. However, such a solution is impractical in the situation where antenna 20 and antenna 30 must be in relatively close proximity such as that of the common antenna site more colloquially known as the "antenna farm." Those skilled in the art, however, appreciate that limiting the amplitude of the $f_1$ signal reaching antenna 20 and amplifier 10 by definition limits or reduces the undesired intermodulation products.

One circuit for reducing the level of the $f_1$ signal reaching amplifier 10 is shown in FIG. 2. The circuit of FIG. 2 is similar to the circuit of FIG. 1A, except that radio frequency circulators 40 and 50 are situated in the signal path between the output of amplifier 10 and antenna 20 as shown. More specifically, circulator 40 includes an input port 40A, an output port 40B, and an isolation port 40C. Circulator 50 includes an input port 50A, an output port 50B, and an isolation port 50C. As seen in FIG. 2, the output of amplifier 10 is coupled to input port 40A such that the $f_c$ carrier signal is provided thereto, and the output port 40B is coupled to the input port 50A. Output port 50B is coupled to antenna 20. It is noted that it is the property of circulators such as circulators 40 and 50 that radio frequency energy flows through such circulators mostly in just one direction. More specifically, using circulator 50 as an example, a radio frequency signal provided to port 50A will travel to port 50B with essentially no attenuation. However, a radio frequency signal such as $f_1$ appearing at port 50B is coupled to isolation port 50C and is dissipated by a load resistor 60 coupled thereto as shown. Thus, undesired signals such as $f_1$ appearing at antenna 20 do not reach circulator input port 50A to a relatively large extent. A degree of isolation from intermodulation is thus achieved by employing circulator 50. Unfortunately, a single circulator such as circulator 50 typically does not provide sufficient isolation from intermodulation problems caused by the $f_1$ signal as is required. Thus, as shown in FIG. 2, another circulator 40 is cascaded with circular 50 to in effect double the isolation in dB from the undesired $f_1$ signal. In summary, the $f_c$ desired signal generated at transmitter power amplifier 10 travels substantially unattenuated through circulators 40 and 50 to antenna 20, whereas the undesired $f_1$ off frequency signal from an adjacent antenna 30 is substantially isolated from amplifier 10 by circulators 40 and 50. Thus, the amplitude of intermodulation products generated at amplifier 10 and associated circuits coupled thereto is reduced.

It is noted that in order to achieve optimum isolation in the manner described above by circulators 40 and 50, it is imperative that load resistors 60 and 70, respectively coupled to isolation ports 50C and 40C exhibit an impedance as close to the characteristic impedance of circulators 50 and 40, respectively, as possible. In other words, if the circulator isolation ports 40C and 50C are terminated in the proper impedance, very high isolation from the undesired $f_1$ signal is obtained.

As many as four circulators have been cascaded together in the manner described above in order to achieve desired isolation from the $f_1$ signal and concurrent intermodulation product protection. Such a four circulator cascade arrangement is shown in FIG. 3 which includes circulator 80 and 90 having respective isolation ports coupled to appropriate termination impedances 85 and 95 as shown. Unfortunately, however, due to temperature variations, system VSWR changes, humidity and other effects, the guaranteed isolation of such cascaded circulators is limited to approximately 25 dB. Another problem with this prior cascaded circulator approach is the relatively high cost of each circulator. In the past, various impedance networks have been coupled from a circulator isolation port to ground in an attempt to achieve a high degree of isolation between the circulator output and the circulator input. Unfortunately, such prior impedance networks are undesirably affected by the temperature variation, system VSWR changes and other effects referred to above such that optimum circulator isolation was not achieved.

It is one object of the present invention to provide apparatus for maximizing the amount of isolation achieved by a radio frequency circulator.

Another object of the present invention is to provide apparatus which minimizes the amount of intermodulation distortion experienced by a radio frequency power amplifier.

Another object of the invention is to provide a variable impedance network capable of selectively synthesizing complex impedances which may be employed to achieve optimal circulator isolation.

These and other objects of the invention will become apparent to those skilled in the art upon consideration of the following description of the invention.

BRIEF SUMMARY OF THE INVENTION

The present invention is directed to providing an apparatus for inhibiting generation of intermodulation products affecting an amplifier circuit amplifying a radio frequency signal exhibiting a predetermined frequency. The apparatus includes a circulator having at least input, output, and isolation ports. The input port is electrically coupled to the output port of the amplifier. The apparatus further includes a reflection circuit which is electrically coupled to the output of the circulator. The reflection circuit generates a reflected radio frequency signal coupled back to the circulator output port. The reflected radio frequency signal exhibits a frequency sufficiently different from the predetermined frequency so as to be distinguishable therefrom. The reflection circuit is adapted to couple the predetermined radio frequency signal to an antenna. A control circuit is electrically coupled to the amplifier for generating a control signal exhibiting indicia of the portion of the reflected radio frequency signal reaching the input port of the circulator. An electronically variable impedance circuit is coupled to the isolation port of the circulator and the control circuit. The electronically variable impedance circuit provides an appropriate impedance to the isolation port in response to said control signal such that the isolation achieved by the circulator is maximized.

The features of the invention believed to be novel are set forth with particularities in the appended claims. The invention itself, however, both as to organization and method of operation, together with further objects and advantages thereof, may best be understood by reference to the following description taken in conjunction with the accompanying drawings.

DESCRIPTION OF THE DRAWINGS

FIG. 7 is a table of impedances plotted on the Smith chart of FIG. 6.

FIGS. 8A and 8B comprise a flow chart of one technique for determining the optimal impedance to be coupled to the isolation port of a circulator to achieve maximum isolation from intermodulation products therefrom.

FIG. 9 is a table showing the states and corresponding reflection coefficients generated by the reflection circuit of FIG. 5.

FIG. 10A is a representation of the reflected voltage vectors generated by the reflection circuit of FIG. 5.

FIG. 10B is a frequency spectrum graph of a carrier signal $f_c$ and a lower sideband signal $f_t$ generated by the action of the reflection circuit of FIG. 5.

FIG. 10C is a frequency spectrum graph of a carrier signal $f_c$ and an upper sideband signal $f_t$ generated by the action of the reflection circuit of FIG. 5.

DETAILED DESCRIPTION OF THE PREFERRED EMBODIMENT

Figure 1A:
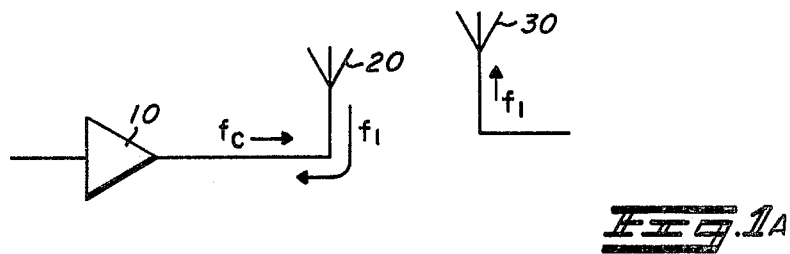
FIG. 1A is a schematic representation of an amplifier vulnerable to intermodulation from signals from a nearby antenna.
Figure 1B:
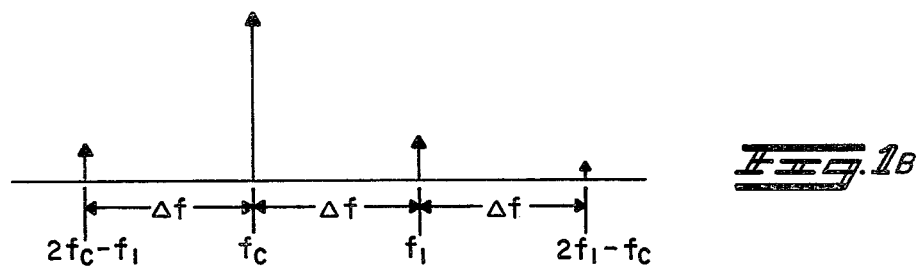
FIG. 1B is a frequency spectrum graph illustrating the problem of intermodulation.
Figure 2:
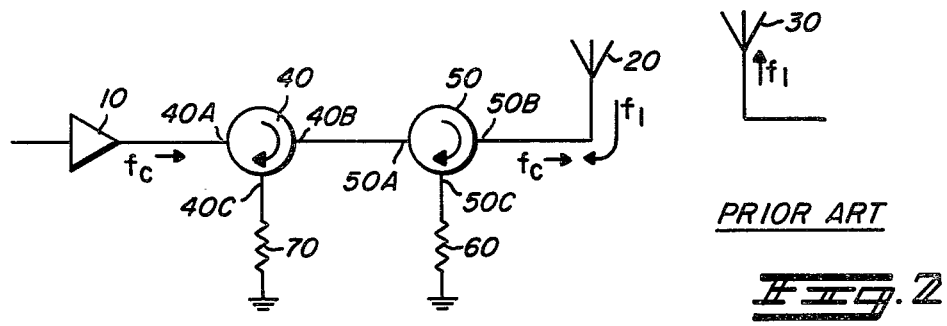
FIG. 2 is a schematic representation of one circuit employing cascaded circulators to inhibit the generation of intermodulation products.
Figure 3:
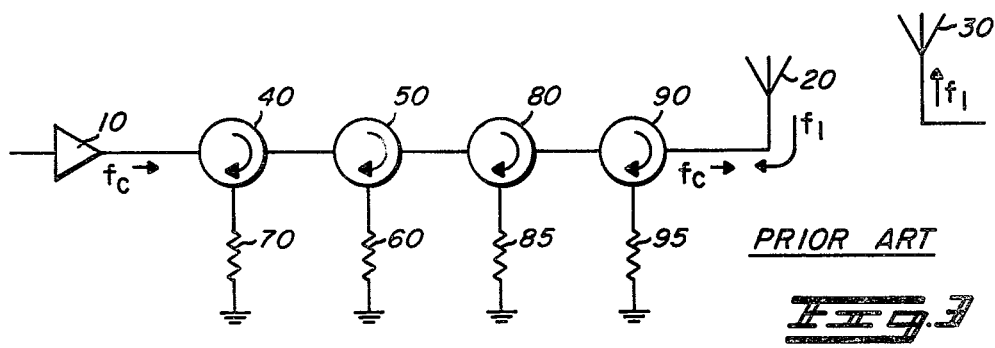
FIG. 3 is a schematic representation of another circuit employing cascaded circulators to inhibit the generation of intermodulation products.
Figure 4:
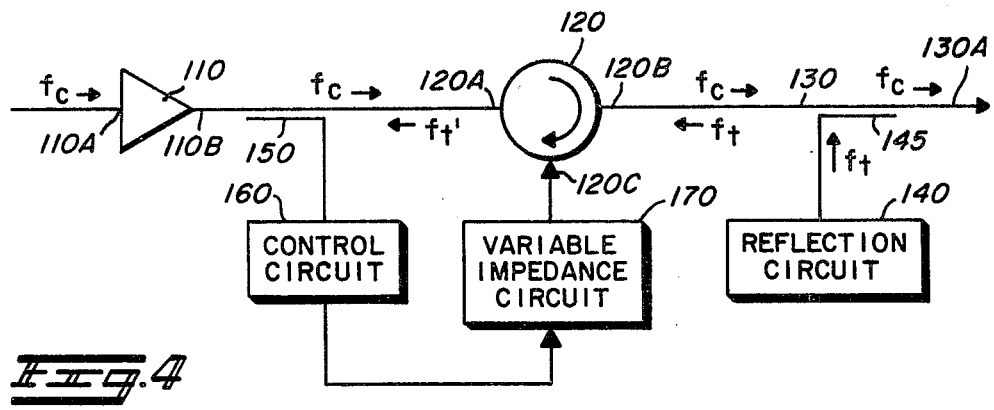
FIG. 4 is a block diagram of apparatus for minimizing the generation of intermodulation products in accordance with the present invention.

FIG. 4 shows a block diagram of the adaptive radio frequency intermodulation minimizing apparatus of the present invention. The apparatus of FIG. 4 includes a radio frequency power amplifier 110, which includes an input 110A and an output 110B. Amplifier 110 amplifies radio frequency signals exhibiting a carrier frequency of $f_c$ which are provided to input 110A. The amplified carrier signal $f_c$ is generated at amplifier output 110B as seen in FIG. 4. Amplifier output 110B is coupled to an input port 120A of a radio frequency circulator 120. Circulator 120 further includes an output port 120B and an isolation port 120C. The carrier signal $f_c$ provided to circulator 120A is coupled through to circulator output 120B with substantially no attenuation. Circulator output 120B is electrically coupled to a transmission line 130 which constitutes the output of the apparatus of FIG. 4. It is thus seen that the carrier signal $f_c$ travels through such apparatus from amplifier input 110A to transmission line output 130A.

A reflection circuit 140 is coupled to transmission line 130 via a coupler 145 situated between circulator output 120B and transmission line output 130A. Reflection circuit 140 generates a radio frequency signal $f_t$ exhibiting characteristics distinguishable from carrier signal $f_c$. In one embodiment of the invention, reflection circuit 140 generates a signal $f_t$ comprised of sideband energy at a frequency somewhat above or somewhat below the frequency of carrier signal $f_c$. The frequency of the $f_t$ signal is sufficiently removed from the frequency of the $f_c$ signal so as to be distinguishable therefrom, for example, $f_t = f_c \pm 10$ kHz in one embodiment. The $f_t$ signal is generated so as to exhibit a relatively small amplitude and is coupled to transmission line 130 via coupler 145 in a loose manner such that the amplitude of $f_t$ is approximately 60 dB below the amplitude of the $f_c$ signal on transmission line 130, for example. Since the $f_t$ signal is distinguishable from the carrier signal $f_c$, the $f_t$ signal may be referred to as a "tag signal."

It is thus seen that the $f_t$ signal generated by reflection circuit 140 is launched toward circulator output 120B as shown by the arrows designating the signal flow path of $f_t$ of FIG. 4. Since the isolation provided by circulator 120 is not ideal, a portion of the $f_t$ signal provided to circulator output 120B reaches circulator input 120A, and is designated $f_t'$ as shown in FIG. 4. The amplitude of $f_t'$ exhibits indicia of the amount of isolation provided by circulator 120. More specifically, the lower the amplitude of $f_t'$ at circulator input 120A, the greater is the isolation from output to input provided by circulator 120 against undesired interfering signals such as the $f_1$ signal already discussed in the Description of the Prior Art. A coupler 150 is situated in the transmission line coupling amplifier output 110B to circulator input 120A such that both the carrier signal $f_c$ and the now attenuated $f_t'$ signal are provided to the input of a control circuit 160. Control circuit 160 separates the $f_t'$ signal (that is, the tag signal) from the $f_c$ carrier signal and generates a control signal therefrom exhibiting indicia of the amplitude of the $f_t'$ signal. Thus, the control signal generated at the output of control circuit 160 exhibits indicia of the amount of isolation provided by circulator 120. For example, in one embodiment of the invention, larger amounts of isolation provided by circulator 120 result in correspondingly smaller amplitude $f_t'$ signals reaching control circuit 160 and thus, under such conditions control circuit 160 generates a control signal with a correspondingly small DC amplitude proportional to the amplitude of the $f_t'$ signal. However, smaller amounts of isolation provided by circulator 120 result in correspondingly larger $f_t'$ signals reaching circulator input port 120A and control circuit 160 such that control circuit 160 generates a control signal having a DC level exhibiting a correspondingly larger amplitude proportional to the amplitude of the $f_t'$ signal. Thus, it is seen that the control signal generated by the control circuit 160 exhibits indicia of the amount of isolation provided by circulator 120. It is again stressed that the amount of isolation provided by circulator 120 is highly dependent upon the particular value of impedance provided to circulator isolation port 120C under the various continually varying ambient circuit operating conditions. The impedance provided to such isolation port 120C must be as closely equal to the somewhat unstable characterstic impedance of isolator 120 which changes with temperature, humidity and other operating conditions already discussed.

The output of control circuit 160 is coupled to the input of an electronically variable impedance circuit 170. The output of impedance circuit 170 is electrically coupled to the isolation port 120C of circulator 120. The control signal from control circuit 160 controls the impedance exhibited by impedance circuit 170 to isolation port 120C such that the appropriate impedance for impedance network 170 is always selected such that circulator 120 passes an optimally minimum $f_t'$ signal and thus achieves a maximum of isolation from output 120B to input 120A. For example, if the $f_t'$ signal was relatively large, control circuit 160 would generate a correspondingly large amplitude control signal. The amplitude of such control signal is varied until an appropriate impedance is selected for impedance circuit 170 which causes the $f_t'$ signal to be minimized and thus the isolation provided by circulator 120 to be maximized. Control circuit 160 and electronically variable impedance circuit 170 are discussed subsequently in more detail.

To aid in understanding the operation of the apparatus of the present invention, the electronically variable impedance circuit 170 is discussed prior to discussion of control circuit 160 which generates control signals to select the appropriate impedance to be exhibited by impedance circuit 170 to result in maximum circulator isolation.

Figure 5:
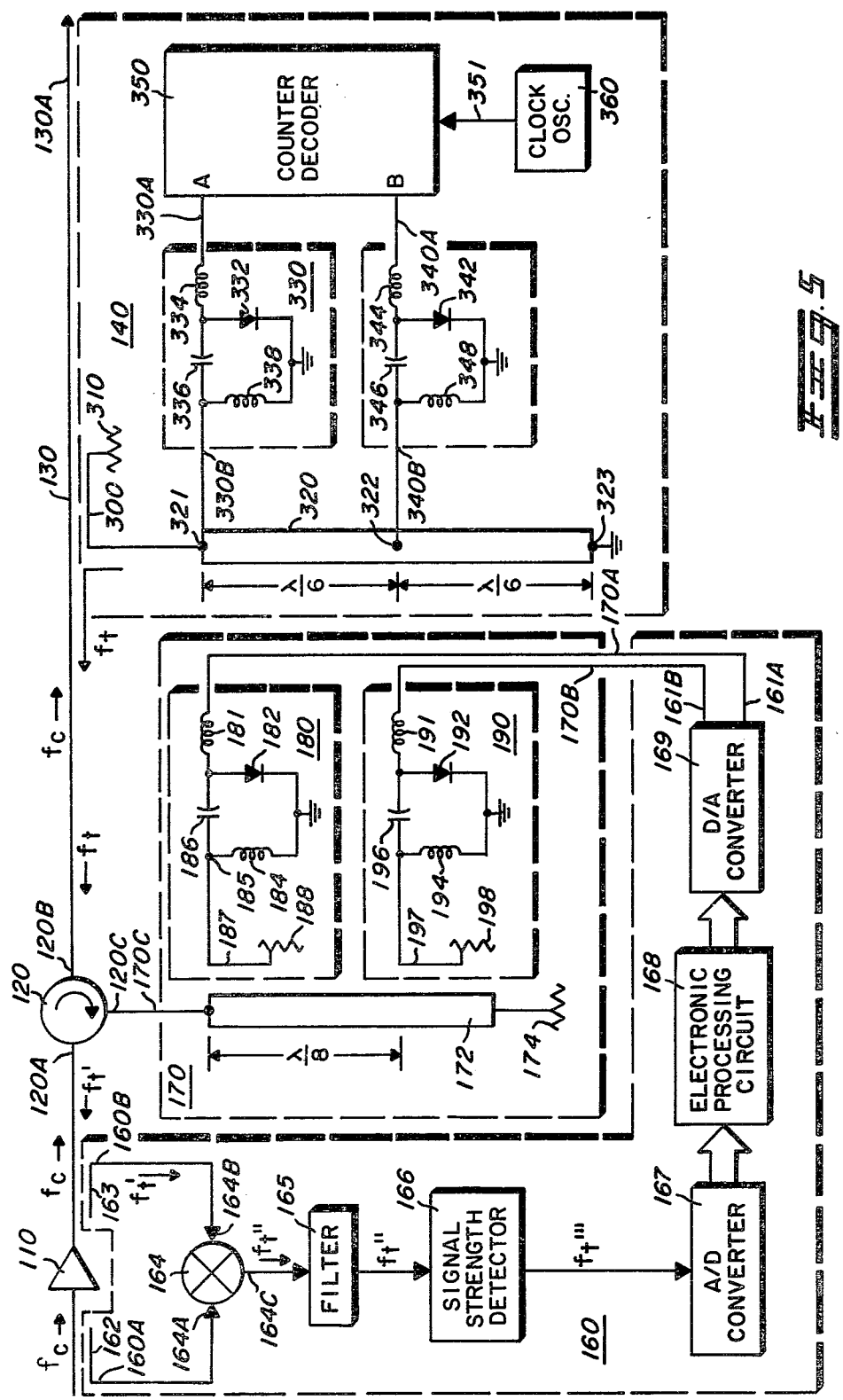
FIG. 5 is a more detailed representation of the diagram of FIG. 4.

FIG. 5 shows a more detailed block diagram of the apparatus of the present invention including one electronically variable impedance circuit 170 which may be employed for the purposes discussed above. More specifically, impedance circuit 170 includes an output port 170C at which the impedance present thereat is varied in accordance with control signals provided to inputs 170A and 170B of impedance circuit 170. It is noted that impedance circuit output 170C is coupled to the isolation port 120C of circulator 120 such that the impedance provided thereto can be selectively varied. Impedance circuit 170 includes a transmission line having one end electrically connected to impedance circuit output 170C and the remaining end coupled to a load resistor exhibiting the characteristic impedance of the circuit element coupled to output 170C, here namely the characteristic impedance of circulator 120, 50 ohms for example.

Impedance circuit 170 includes a first variable impedance network 180. Impedance network 180 includes a variable resistance element, for example, a PIN diode 182, the resistance of which varies in proportion to the voltage applied across such resistance element. PIN diode 182 includes an anode coupled by an inductor 181 to impedance circuit input 170A such that voltage signals provided to impedance circuit input 170A cause the resistance exhibited by PIN diode 182 to vary. The cathode of PIN diode 182 is coupled to ground. An inductor-capacitor circuit comprised of inductor 184 and capacitor 186 connected together in series are together coupled in parallel with PIN diode 182 to cancel out the effects of any parasitic capacitance and inductance exhibited thereby. It is noted that a node 185 is formed at the juncture of inductor 184 and 186. Node 185 is electrically coupled to a coupler 187 which is coupled to transmission line 172 at the end of line 172 facing impedance circuit output 170C. In this embodiment of the invention, coupler 187 is selected to exhibit −10 dB of coupling. Thus, electrical signals which enter in circuit output 170C travel to coupler 187 and see an impedance related to the particular value of the impedance of PIN diode 182 selected by the control signal applied thereto via input 170A.

A second impedance network 190 substantially identical to impedance network 180 is coupled to transmission line 172 at a distance $\lambda/8$ ($\lambda$ is related to the operating frequency of power amplifier 110) from the point at which coupler 187 couples impedance network 180 to transmission line 172. More specifically, impedance network 190 includes an input 170B coupled to an inductor 191 analogous to inductor 181 of impedance network 180. Impedance network 190 further include a PIN diode 192, an inductor 194, a capacitor 196, and a coupler 197 all coupled together in the same manner as the respective elements diode 182, inductor 184, capacitor 186, and coupler 187 of impedance network 180. In this embodiment of the invention, coupler 197 is selected to exhibit slightly more coupling than coupler 187 to compensate for signal losses in coupler 187. For example, in this embodiment, coupler 197 exhibits −9.54 dB of coupling. It is noted that couplers 187 and 197 are respectively terminated in load resistors 188 and 198 typically exhibiting the characteristic impedance of the circulator 120 or other device coupled to impedance circuit output 170C.

Figure 6:
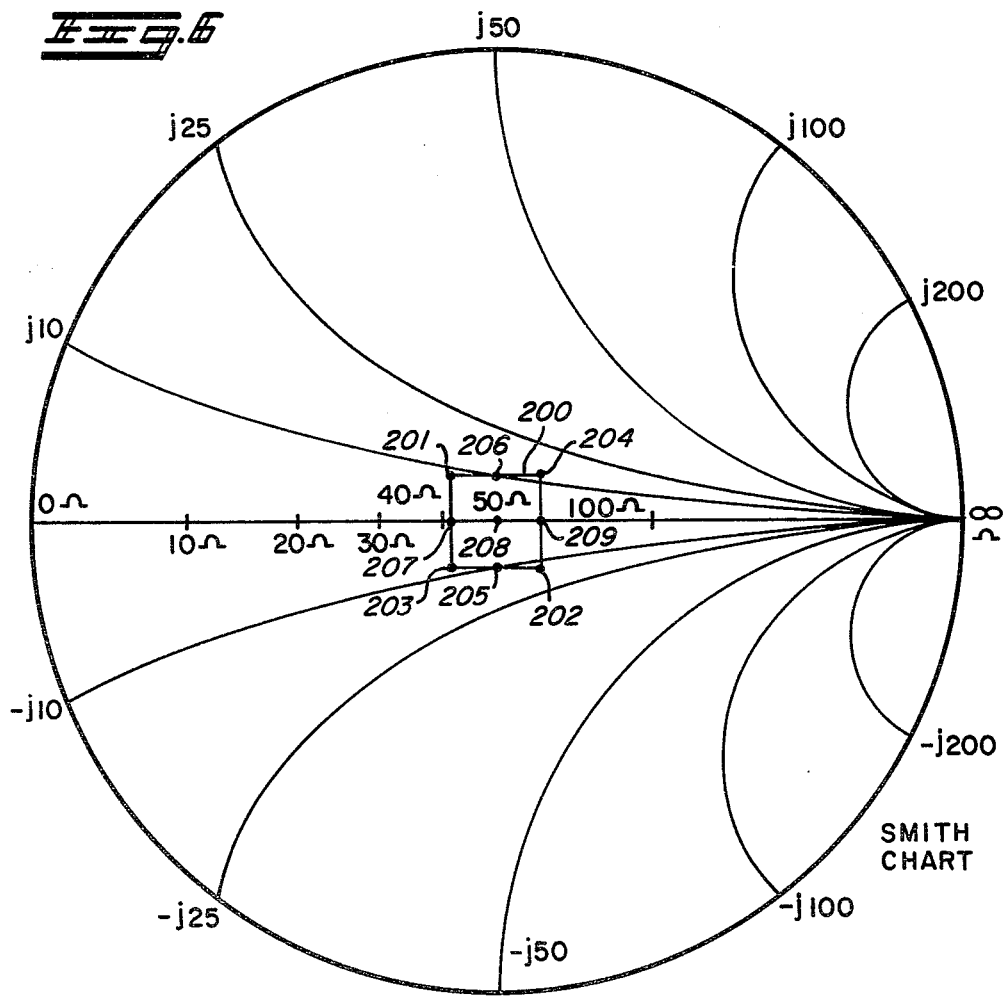
FIG. 6 is a Smith chart showing an impedance square including impedances which are synthesized in the circuit of FIG. 5.

To more fully understand the operation of impedance networks 180 and 190, it is instructive to examine the impedance exhibited by impedance circuit output 170C as the resistances of PIN diodes 182 and 192 are selectably varied according to control signals applied thereto via inputs 170A and 170B, respectively. The impedances which are capable of being synthesized by impedance circuit 170 include and form the boundaries of a square 200 when plotted on a Smith chart as shown in FIG. 6. The range of synthesizable impedances is directly related to the amount of coupling provided by couplers 187 and 197 and will be discussed later in more detail. For convenience, the Smith chart of FIG. 6 is normalized at 50 ohms. FIG. 7 is a chart showing selected resistances for diodes 182 and 192 and the corresponding impedance at impedance circuit output 170C which such resistance combinations cause to be generated. Again it is noted that the resistance exhibited by PIN diodes 182 and 192 are variable substantially from 0 ohms through $\infty$ ohms according to the magnitude of voltage bias supplied thereto via the control signals supplied to respective inputs 170A and 170B. $R_{182}$ and $R_{192}$ are respectively designated as the resistances exhibited by PIN diodes (resistance elements) 182 and 192 in the chart of FIG. 7. $Z_{OUT}$ designates the impedance exhibited by impedance circuit 170 at impedance circuit output 170C. The following four combinations of resistances values for diodes 182 and 192 result in four impedances $Z_{OUT}$ which designate the corners of the aforementioned square 200. More specifically, when diode 182 of impedance network 180 is appropriately biased so as to be turned on and exhibit a resistance of 0 ohms and while at the same time diode 192 of impedance network 190 is appropriately biased to be turned on to also exhibit a resistance of 0 ohms, then, as seen in the chart of FIG. 7, the impedance $Z_{OUT}$ exhibited at output 170C equals $40.2+j8.2$ which is plotted at point 201 on the Smith chart of FIG. 6. Point 201 defines the left uppermost corner of the aforementioned square 200 of possible impedance values. It is noted that this combination of resistance values of diodes 182 and 192 yields an impedance which includes both a real component and a reactive component. When diode 182 is appropriately biased to be turned off and exhibits a resistance equal to $\infty$ ohms and while diode 192 is sumultaneously appropriately biased to be turned off and also exhibit a resistance of $\infty$ ohms, then the impedance $Z_{OUT}$ presented at output 170C is equal to $59.8-j12.2$ and is designated as point 202 on the Smith chart of FIG. 6. Point 202 forms the lower right hand corner of impedance square 200. Again it is noted that a complex impedance, that is one exhibiting both a real part and an imaginary part, is synthesized by employing the immediately aforementioned values of resistance for diodes 182 and 192. When diode 182 is appropriately biased to be turned on so as to exhibit a resistance of 0 ohms and while diode 192 is simultaneously appropriately biased to be turned off to exhibit a resistance of $\infty$ ohms, the output impedance $Z_{OUT}$ exhibited at output 170C equals $40.2-j8.2$, which impedance is designated as point 203 and is shown as such on the Smith chart of FIG. 6. Point 203 forms the lower left corner of the aforementioned impedance square 200. When diode 182 is appropriately biased to be in a turned off state so as to exhibit a resistance of $\infty$ ohms and while diode 192 is simultaneously appropriately biased to a turned on state so as to exhibit a resistance of 0 ohms, then the impedance $Z_{OUT}$ presented by impedance circuit 170 at impedance circuit 170 output C equals $59.8+j12.2$, such impedance being designated point 204 and being plotted as such on the Smith chart of FIG. 6. Point 204 forms the upper right corner of the impedance square 200. On the Smith chart of FIG. 6, lines have been drawn connecting points 201, 204, 202, and 203 so as to form the substantially square geometry of impedance square 200. It is noted that the impedance represented by points 201, 202, 203, and 204 are synthesized by biasing diodes 182 and 192 to exhibit resistance of various combinations of 0 ohms and $\infty$ ohms. However, other impedances within the boundaries of impedance square 200 may also be synthesized by causing diodes 182 and 192 to exhibit impedances with values intermediate between 0 ohms and $\infty$ ohms. Examples of such cases will now be given in detail here. Virtually any impedance on the boundary of impedance square 200 or existing within such boundary may be synthesized by appropriately biasing diodes 182 and 192 to exhibit appropriate resistances which in turn generate the desired output impedance $Z_{OUT}$ at output 170C.

Referring again to the chart of FIG. 7, when diode 182 is appropriately biased to exhibit a resistance of 50 ohms and simultaneously diode 192 is appropriately biased to a turned off state to exhibit a resistance of $\infty$ ohms, then under these conditions $Z_{OUT}$ equals $49.0-j9.9$ which impedance is designated at point 205 on the Smith chart of FIG. 6. Referring again to FIG. 7 in conjunction with FIG. 5, when diode 182 is appropriately biased to exhibit a resistance of 50 ohms and diode 192 is simultaneously appropriately biased to a turned on state so as to exhibit a resistance of 0 ohms, the impedance circuit 170 exhibits an output impedance $Z_{OUT}$ at output 170C equal to $49.0+j9.9$, such impedance being designated point 206 on the Smith chart of FIG. 6.

In the prior two examples wherein impedances corresponding to points 205 and 206 are synthesized by impedance circuit 170, the synthesized impedances 205 and 206 are complex. However, consistent with the present invention, any impedance within the boundaries of impedance square 200 may be synthesized and, moreover, impedances which are substantially completely real (that is, not complex) may be synthesized. For example, when diode 182 is appropriately biased to a turned on state to exhibit a resistance of 0 ohms and simultaneously therewith diode 192 to appropriately biased to exhibit a resistance of 50 ohms, the output impedance of impedance circuit 170, $Z_{OUT}$ equal 40.9 ohms and is designated as point 207 on the real axis of the Smith chart of FIG. 6. Referring again to FIG. 7 in conjunction with FIG. 5, when diode 182 is appropriately biased to exhibit a resistace of 50 ohms and simultaneously therewith diode 192 is appropriately biased to exhibit a resistance also of 50 ohms, then the output impedance $Z_{OUT}$ equals 50 ohms which is designated as point 208 on the real axis of the Smith chart of FIG. 6. Referring once again to FIG. 7 in conjunction with FIG. 5, when diode 182 is appropriately biased to a turned off state so as to exhibit a resistance of $\infty$ ohms, and simultaneously therewith, diode 192 is appropriately biased to exhibit resistance of 50 ohms, then the output impedance $Z_{OUT}$ of impedance network 170 equals 61.11 ohms, such impedance being designated point 209 on the real axis of the Smith chart of FIG. 6. Thus, it is seen that points 207, 208, and 209 exhibiting impedances which are completely real, namely respectively 40.9, 50, and 61.11 ohms, may be synthesized employing electronically variable impedance circuit 170. If it is desired that electronically variable impedance circuit 170 should synthesize impedances having a wider range than that of the embodiment of the invention immediately discussed above (that is, if it is desired that impedance square 200 should occupy a greater portion of FIG. 6), then tigher coupling than the −10 dB employed in coupler 187 and the −9.54 dB employed in coupler 197 should be used. For example, employing −5 dB of coupling for coupler 187 and −3.35 dB for coupler 197 results in a range of real impedances of 28 ohms through 95 ohms being synthesized which corresponds to and is broader than the 40.9 through 61.11 ohms range of the 207 and 209 points discussed immediately above. If an even greater range of impedance values are desired to be synthesized by electronically variable impedance circuit 170, then even tighter coupling is employed for couplers 187 and 197. For example, if coupler 187 exhibits −3 dB of coupling and coupler 197 exhibits −0 dB of coupling, then impedance square 200 is enlarged to such an extent that real components of impedance ranging from 15 ohms to 200 ohms may be synthesized, for example. Of course, in the last two above discussed cases wherein the coupling of couplers 187 and 197 is tighter than the −10 dB and −9.54 dB, respectively, of the present embodiment of the invention, a wider range of complex impedances as well as real components may also be synthesized as compared with the present embodiment of the invention. Clearly, looser coupling for couplers 187 and 197 (for example, −20 dB and −19.96 dB, respectively) may be provided if it is desired to shrink the size of impedance square 200 such that a smaller range of complex or real impedances are capable of being synthesized.

In conclusion of the discussion of electronically variable impedance network 170, it is seen that virtually any impedance within impedance square 200 may be synthesized according to appropriate values of biased voltage applied to iputs 170A and 170B to select the desired output impedance $Z_{OUT}$. It is the purpose of the control circuit 160 which will now be discussed to provide such appropriate control signals (control voltages or bias voltages) which will select an impedance for electronically variable impedance network 170 which will match the somewhat variable impedance of circulator 120 so as to maximize the isolation provided by circulator 120 from undesired radio frequency signals $f_1$ entering circulator port 170B and potentially passing through to circulator port 170A.

For purposes of the subsequent discussion of control circuit 160, it is assumed that the reflection circuit 140 (discussed later in full detail) generates a tag signal, $f_t$, having a frequency equal to $f_c$−10 kHz. The $f_t$ signal which is relatively weak compared to the $f_c$ carrier signal (for example, 60 dB below the $f_c$ signal) travels through circulator 120 from output port 120B to input port 120A at which point it is designated the $f_t'$ signal after being attenuated by circulator 120. The $f_t'$ signal is provided to an input of control circuit 160 of FIG. 5 in a manner soon described. At this point, however, a recapitulation of the purpose of control circuit 160 of FIG. 5 is instructive. Control circuit 160 separates indicia of the $f_t'$ signal from the $f_c$ carrier signal present at amplifier 110. Moreover, control circuit 160 generates appropriate signals at outputs 161A and 161B to cause electronically variable impedance circuit 170 to present an appropriate impedance to circulator isolation port 170C to minimize the $f_t'$ signal and thus assure that circulator 120 provides a maximum of isolation from signals which might otherwise cause undesirable intermodulation. Although control circuit 160 generates distinct control signals at outputs 161A and 161B, for convenience such control signals may collectively be referred to as a single control signal at times.

Control circuit 160 includes couplers 162 and 163 which comprise inputs 160A and 160B of control circuit 160, respectively. Coupler 162 is coupled to an input 164A of mixer circuit 164 such that the $f_c$ carrier is provided to input 164A. Mixer circuit 164 is a conventional mixer circuit well known to those skilled in the art. Coupler 163 is coupled to a second input 164B of mixer circuit 164 such that the $f_t'$ tag signal is provided to input 164B. The mixing action of mixer circuit 164 mixes the $f_c$ carrier signal and the $f_t'$ tag signal in such a manner that what is typically termed a base band signal, $f_t''$, is generated at mixer output 164C. More specifically, mixer circuit 164 generates a signal $f_t''$ at output 164C, the frequency of which equals the difference in frequency between the $f_c$ carrier signal and the $f_t'$ tag signal. Thus, in this instance wherein the $f_t'$ signal exhibits a frequency 10 kHz (for example) less than the frequency of the $f_c$ carrier signal, the $f_t''$ signal generated at mixer output 164C exhibits a frequency equal to 10 kHz plus some second order and other harmonics. It is noted that the amplitude of the $f_t''$ signal yields indicia of the amount of isolation provided by circulator of 120. That is, if the $f_t''$ signal exhibits a relatively high value, then circulator 120 is providing a relatively small amount of isolation. However, if the $f_t''$ signal is a relatively small value, then the amount of isolation provided by circulator 120 is correspondingly relatively high. Of course, this latter case is more desirable. It is thus appreciated that control circuit 160 functions to minimize the $f_t''$ signal and thus maximize circulator 120 isolation.

The output 164C of mixer circuit 164 is coupled to the input of a bandpass filter 165. Bandpass filter 165 provides a bandpass sufficiently narrow to strip away any undesired second order or other harmonics which may be undesirably superimposed upon the $f_t''$ signal provided thereto. In this example of the invention, since the $f_t''$ signal exhibits a frequency of 10 kHz, the center frequency of the bandpass filter 165 is likewise 10 kHz. A filtered $f_t''$ is thus generated at the output of bandpass filter 165.

The output of bandpass filter 165 is coupled to the input of a signal strength detector 166. Signal strength detector 166 generates a signal at its output exhibiting a DC level (or amplitude) corresponding to the amplitude of the filtered $f_t''$ signal supplied to the input of detector 166. The output signal of signal strength detector 166 is designated $f_t'''$ and is proportional (in this embodiment inversely) to the amount of isolation provided circulator 120.

Figure 8A:
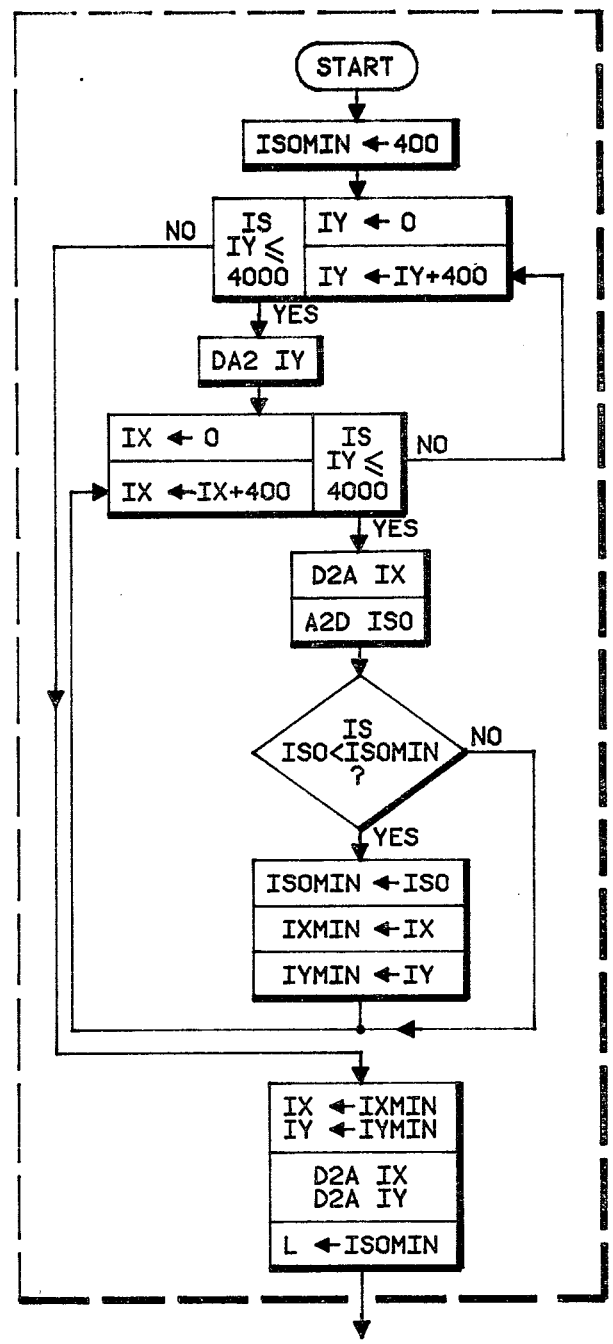

The output of signal strength detector 166 is coupled to the input of an analog to digital converter 167 such that the $f_t'''$ output signal of detector 166 is provided to the input of converter 167. Thus, the analog $f_t'''$ signal is converted to digital signals at the output of converter 167 which exhibit indicia of amplitude of the filtered $f_t'''$ signal. The output of analog to digital converter 167 is coupled to the input of an electronic processing circuit 168. The output of processing circuit 168 is coupled via a digital to analog converter 169 to control circuit outputs 161A and 161B. Control circuit outputs 161A and 161B are respectively coupled to electronically variable impedance circuits inputs 170A and 170B such that the control signals generated at outputs 161A and 161B selectively determine the impedance exhibited by impedance circuit 170. Electronic processing circuit 168 preferably constitutes a microprocessor, for example, the model 6800 microprocessor manufactured by Motorola, Inc. Electronic processing circuit 168 is typically programmed to cause digital to analog converter 169 to generate respective control signals at control circuits outputs 161A and 161B such that impedance circuit 170 is instructed to exhibit an impedance which minimizes the $f_t'''$ signal provided to the input of converter 167, thus resulting in circulator 120 exhibiting an optimal maximum of isolation. (It is noted that minimization of the $f_t'''$ signal in this manner correspondingly desirably achieves minimization of the $f_t'$ and $f_t''$ signals). Processing circuit 168 typically operates in a first mode to coarsely determine appropriate control signals at outputs 161A and 161B such that a rough approximation of the particular impedance within impedance square 200 of FIG. 6 is located which results in minimizing $f_t'''$ and maximizing the isolation of circulator 120. This may be accomplished by the "Grid Search" approach employed in the section of the flow chart of FIG. 8A designated 250. After completing such a coarse determination in the first mode, electronic processing circuit 168 typically operates in a second mode designated 260 on the flow chart of FIG. 8B to zero in on the particular control signals for outputs 161A and 161B which will cause impedance circuit 170 to generate the particular impedance within impedance square 200 of FIG. 6 which will result in minimizing the $f_t'''$ and thus maximizing circulator 120 isolation. The approach employed in the example given in the flow chart of FIG. 8A and FIG. 8B is a "dithering" approach appreciated by those skilled in the art.

Electronic processing circuit 168 includes a random access memory (RAM—not shown) into which the object code of FIG. 9 is conveniently read in order to cause electronic processing circuit 168 to perform in the above described manner.

As already discussed in general, the adaptive intermodulation minimization apparatus of the present invention shown in FIG. 5 includes a reflection circuit 140 coupled to connecting line 130 to generate a relatively low level signal $f_t$ sufficiently displaced in frequency from the carrier signal $f_c$ so as to be distinguishable therefrom and thus comprise a tag signal. One circuit which may be employed as reflection circuit 140 is shown in detail in FIG. 5. Reflection circuit 140 operates in a manner whereby the impedance exhibited thereby and presented to coupling point 321 is cycled through three impedance states each with a reflection coefficient $\rho$ of approximately equal to one but with angles 120° apart. Refelection circuit 140 cycles among the three aforementioned states at a rate or frequency equal to $f_s$. Thus, a modulation sideband exhibiting a frequency of $f_c+f_s/3$ or $f_c-f_s/3$ is generated depending upon various operating parameters which will be subsequently discussed in detail.

Reflection circuit 140 includes a coupler 300 having one port thereof terminated in a load resistance 310 equal to the characteristic impedance of coupler 300. Since it is desirable that the $f_t$ tag signal exhibits a relatively low level with respect to the amplitude of the $f_c$ carrier signal, for example 60 dB below the $f_c$ signal, coupler 300 is selected to exhibit −30 dB of coupling in the embodiment of this example. (Note, −30 dB + −30 dB = −60 dB). Coupler 300 includes a remaining port electrically connected to one end of a transmission line having a length of $2\lambda/6$ or $\lambda/3$. $\lambda$ is the wavelength associated with the frequency $f_c$. Transmission line 320 includes three connection points—321, 322, and 323. Coupling points 321 and 323 are situated at the opposed ends of transmission line 320 and thus are situated a distance $\lambda/3$ apart. Coupling point 322 is situated at the midpoint of transmission line 320, that is, half way between coupling points 321 and 323. Therefore, the distance between connection point 321 and 322 is $\lambda/6$ and the distance between connection point 322 and connection point 323 is likewise $\lambda/6$. Connection point 323 is coupled to ground as seen in FIG. 5.

Reflection circuit 140 includes a first variable impedance network 330 having an input 330A and an output 330B. Impedance network 330 is appropriately configured such that when a logical one or high is provided to input 330A, the impedance exhibited at output 330B is essentially equal to 0 ohms or a short circuit to ground. More specifically, impedance network 330 includes a PIN diode 332 which exhibits a resistance varying with the magnitude of the voltage applied across such diode. The anode of diode 332 is coupled via an inductor 334 to input 330A and one terminal of a capacitor 336. The remaining terminal of capacitor 336 is coupled by an inductor 338 to ground at which ground point the cathode of diode 332 is also connected as shown in FIG. 5. Capacitor 336 and inductor 338 cooperate to cancel out or minimize the effects of any parasitic capacitance and inductance associated with diode 332. The node formed between capacitor 336 and inductor 338 is connected to output 330B such that diode 332 which exhibits variable resistance is coupled to coupling point 321 of transmission line 320.

Reflection circuit 140 includes a second variable resistance network 340 having an input 340A and an output 340B. Variable resistance network 340 is substantially similar to variable resistance network 330 discussed above. When a logical one or voltage high is provided to input 340A, variable resistance network 340 exhibits a resistance essentially equal to 0 ohms or a short circuit to ground at output 340B. However, if a logical zero is supplied to input 340A, the impedance exhibited at output 340B is substantially equal to $\infty$ ohms. Resistance network 340 includes a PIN diode 342, an inductor 344, a capacitor 346 and an inductor 348 connected together in substantially the same manner as respective elements 332, 334, 336, and 338 of resistance network 330 with the following modification. The juncture or node formed between capacitor 346 and inductor 348 constitutes the output 340B of variable resistance network 340 and is coupled to coupling point 322 of transmission line 320.

Reflection circuit 140 includes a counter-decoder circuit 350 which includes two outputs designated A and B as shown in FIG. 5. Counter-decoder 350 generates a logical zero or a logical one at outputs A and B in accordance with the state table of FIG. 9 which will be discussed subsequently in more detal. Counter-decoder 350 changes the selected combination of logical one and logical zero applied to outputs A and B at a rate or frequency determined by the frequency $f_s$ of a clock oscillator 360 coupled to a clock input 351 of counter-decoder 350.

As seen in the state table of FIG. 9, when counter-decoder 350 is in state 1 wherein output A is a logical one and output B is a logical zero, then the reflection coefficient ρ presented to coupling point 321 by reflection circuit 140 is equal to 1 at an angle of 180° as seen in the chart of FIG. 9. However, assuming the frequency $f_s$ of clock oscillator 360 equals 30 kHz, then 33.3 microseconds later counter-decoder circuit switches to state 2 wherein output A equals a logical zero and output B equals a logical one. Under these conditions, the reflection coefficient ρ presented to coupling point 321 by reflection circuit 140 is equal to 1 at an angle of 60°. Another 33.3 microseconds later, as determined by $f_s$, state 3 commences (66.6 microseconds after the commencement of state 1) wherein counter-decoder circuit 350 exhibits a logical zero at output A and a logical zero at output B. Under these conditions, the reflection coefficient ρ presented to coupling point 321 by reflection circuit 140 equals 1 at an angle of −60° as seen in the chart of FIG. 9. At a point in time, 33.3 microseconds later, counter-decoder circuit 350 again commences the state 1 wherein output A equals 1 and output B equals logical zero. It is seen that states 1, 2, and 3 are repeated every 100 microseconds in accordance with the selected frequency $f_s$ of clock oscillator 360.

And now in more detail, the manner in which reflection network 140 cycles among the three above described impedance states each having angles 120° apart is discussed.

For sake of simplicity, the portion of the $f_c$ carrier signal coupled into reflection circuit 140 via coupler 300 is referred to as $V_r$ as it travels through the various elements comprising reflection circuit 140. The $V_r$ signal is affected by the changing reflection coefficient ρ at coupling point 321 in the manner described above and shown in FIG. 9 every 33.3 microseconds in such a manner that the aforementioned lower side band signal at frequency $f_t$ is generated when the $V_r$ signal exits reflection circuit 140 and returns to line 130.

More specifically, when reflection circuit 140 is in state 1, that is, counter 350 output A exhibits a logical one and output B of counter 350 exhibits a logical zero, then diode 332 is turned on and exhibits 0 ohms or a short circuit. Thus, the $V_r$ signal travels from coupling point 321 over to diode 332 where it is completely and immediately reflected back to coupler 300. Thus, it is seen that under these conditions a reflection coefficient ρ equal to 1 at an angle of 180° is exhibited to the $V_r$ signal. Since complete reflection of the $V_r$ signal occurred at diode 332, the $V_r$ signal did not travel via transmission line 320 to diode 342. Referring now to FIG. 10A, the corresponding voltage vector generated by reflection network 140 under the state 1 conditions are graphically displayed at the line designated state 1.

When reflection circuit 140 changes to state 2 such that counter-decoder 350 provides a logical zero to output A thereof and a logical one to output B thereof, diode 332 is turned off and exhibits a resistance of ∞ ohms while diode 342 is shorted and exhibits a resistance of 0 ohms. Thus under these conditions, the $V_r$ signal travels from coupler 300 to coupling point 321 through transmission line 320 to coupling point 322 and in so doing accrues −60° of phase shift (the λ/6 length of transmission line between points 321 and 322 corresponds to −60° of phase shift). Upon reaching connection point 322, the $V_r$ signal travels to shorted diode 342 which completely reflects the $V_r$ signal back to coupling point 322 resulting in an additional phase shift of −180°. The $V_r$ signal then travels along transmission line 320 from coupling point 322 to connection point 321 and accrues an additional −60° of phase shift as it travels along this λ/6 distance. Thus, it is seen that the total phase shift experienced by the $V_r$ signal equals −300° which corresponds to 60°. Therefore under the operating conditions of state 2 as shown in FIG. 9 and discussed above, a reflection coefficient ρ of 1 at an angle of 60° is presented to the $V_r$ signal. The $V_r$ signal under such state 2 conditions is graphically depicted in FIG. 10A by the arrow designated state 2.

Under the state 3 operating conditions shown in FIG. 9 where counter-decoder 350 generates a logical zero at its output A and a logical zero at its output B, both diodes 332 and 342 are turned off and thus exhibit a resistance of ∞ ohms. Thus, the $V_r$ signal travels from coupler 300 to transmission line connection point 321 along transmission line 320 to transmission line connection point 322. While traveling along this distance, the $V_r$ signal is phased shifted by −60° (the λ/6 distance between points 321 and 322 on transmission line 320 corresponds to −60° of phase shift). Upon reaching coupling point 322, the phase shifted $V_r$ signal is phase shifted an additional −60° as it travels the λ/6 distance from coupling point 322 down to the end of the transmission line at coupling point 323. It is noted that coupling point 323 is shorted to ground and thus upon reaching such coupling point 323, the $V_r$ signal experiences an additional phase shift of −180°, that is, complete reflection back toward the opposite end of transmission line 320, namely toward coupling point 321 and coupler 300. As the $V_r$ signal travels back from the short at coupling point 323 to coupling point 322, the $V_r$ signal accrues an additional −60° of phase shift. Further, when the $V_r$ signal travels the remaining distance of transmission line 320 from coupling point 322 to coupling point 321, the $V_r$ signal accrues yet another −60° of phase shift. Thus, in total, as the $V_r$ signal travels down transmission line 320 to the short a coupling point 323 and back to coupling point 321 and coupler 300, such $V_r$ experiences a total phase shift of −420° which corresponds to a phase shift of −60°. Thus, under these state 3 operating conditions, the $V_r$ signal is subjected to a reflection coefficient ρ equal to 1 at an angle of −60° by reflection circuit 140. Such state 3 operation is represented by the arrow designated state 3 in FIG. 10A.

In FIG. 10A, it is noted that an arrow representing the carrier signal $f_c$ is drawn. As seen in FIG. 10A, it is noted that the $V_r$ signal is rotated through the three states (1, 2, and 3) in a clockwise manner as shown by the three curved arrows labeled 120°. However, it is noted that with respect to the $V_r$ signal which varies through these three states in a clockwise manner, the $f_c$ carrier signal rotates in an opposite, that is counter-clockwise, direction relative to the changing $V_r$ signal. This relative counter-clockwise rotation of the $f_c$ signal is designated by a curved line in the counter-clockwise direction drawn intercepting the $f_c$ line of FIG. 10A. Under these operating conditions wherein the $f_c$ carrier signal is rotating counter-clockwise relative to the clockwise rotation of the varying $V_r$ signals, a lower sideband signal is generated at a frequency $f_t$ as shown in FIG. 10B. Such lower sideband signal $f_t$ is by definition below carrier signal $f_c$. The frequency of the lower sideband signal $f_t$ equals $f_c - f_s/3$. To reiterate, $f_s$ equals the frequency at which reflection circuit 140 rotates among the three impedance states associated therewith shown both in FIG. 9 and graphically in FIG. 10A.

It is noted that if the direction of rotation among the three impedance states represented in FIG. 9 and FIG. 10A is changed from clockwise to counter-clockwise, that is, if impedance circuit 140 assumes state 3 first, then state 2 and then state 1 and so forth in repetition ad infinitum, then since both the $f_c$ carrier signal and the three impedance states associated with the $V_r$ signal are rotating counter-clockwise, both in the same direction, a resulting upper sideband signal will be generated on line 130 by action of reflection circuit 140. Such upper sideband signal is designated $f_t$ and is shown in FIG. 10C as exhibiting a frequency above that of carrier signal $f_c$. The frequency of upper sideband signal $f_t$ equals $f_c + f_s/3$.

Thus, in summary, reflection circuit 140 generates a tag signal $f_t$ sufficiently removed in frequency from the $f_c$ carrier signal to be distinguishable therefrom. In the above discussion, a method for inhibiting the generation of intermodulation products in a radio frequency amplifier coupled to a circulator is disclosed. In summary, the method includes generating a first signal from a circulator output signal. The first signal exhibits a frequency sufficiently different from the frequency of the circulator output signal so as to be distinguishable therefrom. The first signal is applied to the output of the circulator to generate a second signal at the input of the circulator. The second signal exhibits indicia of the intermodulation isolation exhibited by the circulator. The method further includes varying an impedance coupled to the isolation port of the circulator in response to the second signal so as to maximize the intermodulation isolation exhibited by the circulator.

The foregong describes adaptive radio frequency intermodulation minimizing apparatus which maximizes the amount of isolation achieved by a radio frequency circulator while minimizing the amount of intermodulation distortion experienced by a radio frequency power amplifier.

Further, the foregoing describes an electronically variable impedance circuit for synthesizing various real or complex impedances whether inductive or capacitive in a selectable manner.

While only certain preferred features of the invention have been shown by way of illustration, many modifications and changes will occur through those skilled in the art. It is, therefore, to be understood that the present claims are intended to cover all such modifications and changes as fall within the true spirit of the invention.

What is claimed is:

1. An apparatus for inhibiting generation of intermodulation products affecting an amplifier circuit amplifying a radio frequency signal exhibiting a predetermined frequency comprising:
   a circulator including at least input, output and isolation ports, said input port being electrically coupled to the output of said amplifier;
   reflection circuit means, electrically coupled to the output port of said circulator, for generating a reflected radio frequency signal coupled back to said circulator output port, said reflected radio frequency signal exhibiting a frequency sufficiently different from said predetermined frequency signal so as to be distinguishable therefrom, said reflection circuit means being adapted to couple said predetermined radio frequency signal to an antenna;
   control circuit means, electrically coupled to said amplifier, for generating a control signal exhibiting indicia of the portion of the reflected radio frequency signal reaching the input port of said circulator, and
   electronically variable impedance means, coupled to the isolation port of said circulator and to said control circuit means, for providing an appropriate impedance to said isolation port in response to said control signal such that the isolation achieved by said circulator is maximized.

2. The apparatus of claim 1 wherein said control circuit means includes mixer circuit means, coupled to the input of said circulator, for separating the portion of the reflected radio frequency signal reaching the input port of said circulator from said signal of predetermined frequency to generate a first signal.

3. The apparatus of claim 2 wherein said control circuit means includes electronic processing means, operatively coupled to said mixer circuit means, for generating said control signal such that said control signal includes information capable of instructing said impedance means to exhibit the appropriate impedance to cause the isolation of said circulator to be maximized.

4. The apparatus of claim 3 wherein said control circuit means includes a bandpass filter coupled between the output of said mixer circuit means and said electronic processing means.

5. An apparatus for inhibiting generation of intermodulation products affecting an amplifier circuit amplifying a radio frequency signal exhibiting a predetermined frequency comprising:
   a circulator including at least input, output and isolation ports, said input port being electrically coupled to the output of said amplifier;
   reflection circuit means, electrically coupled to the output port of said circulator, for generating a reflected radio frequency signal coupled back to said circulator output port, said reflected radio frequency signal exhibiting a frequency sufficiently different from said predetermined frequency signal so as to be distinguishable therefrom, said reflection circuit means being adapted to couple said predetermined radio frequency signal to an antenna;
   electronic processing means, operatively coupled to said amplifier for generating a control signal exhibiting indicia of the portion of the reflected radio frequency signal reaching the input port of said circulator, and
   electronically variable impedance means, coupled to the isolation port of said circulator and to said processing means, for providing an appropriate impedance to said isolation port in response to said control signal such that the isolation achieved by said circulator is maximized.

6. The apparatus of claim 5 including mixer circuit means, coupled between said amplifier and said electronic processing means, for separating the portion of the reflected radio frequency signal reaching the input port of said circulator from said signal of predetermined frequency to generate a first signal which is provided to said electronic processing means.

7. The apparatus of claim 6 wherein a bandpass filter is coupled between said mixer circuit means and said electronic processing means.

8. The apparatus of claim 7 wherein a signal strength detector is coupled between said bandpass filter and said electronic processing means.

9. An apparatus for inhibiting generation of intermodulation products affecting an amplifier circuit amplifying a radio frequency signal exhibiting a predetermined frequency comprising:

a circulator including at least input, output and isolation ports, said input port being electrically coupled to the output of said amplifier;

reflection circuit means, electrically coupled to the output port of said circulator, for generating a reflected radio frequency signal coupled back to said circulator output port, said reflected radio frequency signal exhibiting a frequency sufficiently different from said predetermined frequency signal so as to be distinguishable therefrom, said reflection circuit means being adapted to couple said predetermined radio frequency signal to an antenna;

microprocessor means, operatively coupled to said amplifier for generating a control signal exhibiting indicia of the portion of the reflected radio frequency signal reaching the input port of said circulator, and electronically variable impedance means, coupled to the isolation port of said circulator and to said microprocessor means, for providing an appropriate impedance to said isolation port in response to said control signal such that the isolation achieved by said circulator is maximized.

10. The apparatus of claim 9 wherein said microprocessor means includes a random access memory.

11. The apparatus of claim 9 including mixer circuit means, coupled between said amplifier and said electronic processing means, for separating the portion of the reflected radio frequency signal reaching the input port of said circulator from said signal of predetermined frequency to generate a first signal which is provided to said electronic processing means.

12. The apparatus of claim 11 wherein a bandpass filter is coupled between said mixer circuit means and said microprocessor means.

13. The apparatus of claim 12 wherein a signal strength detector is coupled between said bandpass filter and said microprocessor means.

* * * * *